(12) United States Patent
Cunningham et al.

(10) Patent No.: US 9,501,590 B1
(45) Date of Patent: Nov. 22, 2016

(54) SYSTEMS AND METHODS FOR TESTING INTEGRATED CIRCUIT DESIGNS

(71) Applicant: Cadence Design Systems, Inc., San Jose, CA (US)

(72) Inventors: Paul A. Cunningham, San Jose, CA (US); Steev Wilcox, San Jose, CA (US); Vivek Chickermane, Ithaca, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 14/639,014

(22) Filed: Mar. 4, 2015

(51) Int. Cl.
*G06F 17/50* (2006.01)
(52) U.S. Cl.
CPC ....... *G06F 17/5022* (2013.01); *G06F 17/5081* (2013.01)
(58) Field of Classification Search
CPC ........................................... G06F 17/50

USPC .......................................... 716/107
See application file for complete search history.

(56) References Cited

U.S. PATENT DOCUMENTS

2008/0091995 A1* 4/2008 Baik .............. G01R 31/318541
714/726

* cited by examiner

*Primary Examiner* — Thuan Do
(74) *Attorney, Agent, or Firm* — Kaye Scholer LLP

(57) ABSTRACT

A CoDec in a design for test integrated circuit. In embodiments described herein, portions of the CoDec are distributed over the area of the IC. In particular, both the compressor and the decompressor may be distributed over the IC. To this end, XOR gates are located locally to the scan chains over the area of the chip to reduce wire length back to the input/output test pins. The compressor and decompressor may be distributed in a 2-dimensional grid. The compressor may XOR each scan chain in two different directions such that a fault may be resolved back to a specific region of the IC.

11 Claims, 10 Drawing Sheets

SYSTEMS AND METHODS FOR TESTING INTEGRATED CIRCUIT DESIGNS

The present patent document relates to systems and methods for testing integrated circuit designs. More particularly, the present patent document relates to systems and methods for construction of distributed test compression and decompression logic.

BACKGROUND

Test Compression is a technique used as part of a Design For Test ("DFT") method to reduce the time and cost of testing integrated circuits. Straightforward application of scan techniques can result in large vector sets with corresponding long tester time and memory requirements. Test Compression techniques address this problem, by decompressing the scan input on chip and compressing the test output. Test Compression allows highly compressed test stimuli to be applied from low-pin count testers and compressed test responses to be measured. Large gains are possible since any particular test vector usually only needs to set and/or examine a small fraction of the scan chain bits.

The first ICs were tested with test vectors created by hand. It proved very difficult to get good coverage of potential faults, so DFT based on scan and automatic test pattern generation ("ATPG") were developed to explicitly test each gate and path in a design. These techniques were very successful at creating high-quality vectors for manufacturing test, with excellent test coverage. However, as chips got bigger the ratio of logic to be tested per input/output test pin increased dramatically. Accordingly, trying to input the huge volume of scan test sequences into the chip via only a fixed (and often very minimal) number of test pins started causing a significant increase in test time, and required tester memory. This raised the cost of testing.

Test Compression was developed to help address this problem. When an ATPG tool generates a scan chain for a fault, or a set of faults, only a small percentage of scan cells in the scan chain need to take specific values. The rest of the cells in the scan chain are "don't care", and are usually filled with random values. Scan chains are typically loaded by shifting them into the registers 1 bit per clock cycle and thus, the longer the scan chain the more time it takes to load. Loading and unloading long scan chains, also known as vectors, is not a very efficient use of tester time.

Test Compression takes advantage of the small number of significant values to reduce test data and test time. In general, the idea is to modify the design to increase the number of internal scan chains, each of shorter length. Shorter chain lengths reduce the test data volume as well as the test application time.

The scan chains are driven by an on-chip Compression logic and observed on the output side by an on-chip Decompressor. For example a Decompressor is usually designed to allow continuous flow decompression where the internal scan chains are loaded as the test response data from the previous test is delivered to the Decompressor. The Compression DFT logic is traditionally located in a single location on the chip. Accordingly, increased Compression DFT logic creates a higher scan wiring congestion as more wires need to be routed to and from the Compression DFT logic to support the shorter scan chains. Impact on congestion can be extreme for compression ratios beyond 100× since lots of wires terminate and originate from a small piece of compression logic. Traditional global placement has been found to be insufficient in many cases to route the scan wiring. It has been observed that back-end tools cannot impact structuring of Test Compression logic to mitigate congestion since there are too many restrictions in the construction of the scan chains as described in the ScanDEF format. Methods such as improved XOR mapping, partitioned Compressor-Decompressors (CoDecs), etc., are mainly incremental fixes.

Chips continue to increase in size and sophistication at accelerating rates. Every technology node has seen an increase in test data volume due to the higher gate counts and more advanced fault modeling. Increasing demand for rapid ramp up to high volume while maintaining low defective parts per million ("DPPM") is leading to more investment in Test Compression technology. A survey of leading edge DFT customers has led to the conclusion that a 5-10× increase in compression efficiency is a pressing need. Accordingly, there is a need for a highly efficient, correct-by-construction and predictable method that supports increasing compression ratios including those over 500×.

SUMMARY OF THE EMBODIMENTS

In view of the foregoing, an objective according to one aspect of the present patent document is to provide systems and methods for testing integrated circuit design using distributed compressors and/or decompressors. Preferably the methods and apparatuses address, or at least ameliorate one or more of the problems described above. To this end, a CoDec in a design for test integrated circuit is provided. In one embodiment, the CoDec comprises:

a plurality of XOR gates connecting a plurality of scan chains, the XOR gates physically located starting on a first side of the integrated circuit and progressing across the circuit to a second side on the opposite side from the first side, wherein the output of the XOR gates, starting on the first side, are connected to the input of an XOR gate in the direction of the second side; a second plurality of XOR gates connecting the plurality of scan chains, the XOR gates physically located starting on a third side of the integrated circuit adjacent to the first side and progressing across the circuit to a fourth side on the opposite side from the third side, wherein the output of the XOR gates, starting on the third side, are connected to the input of an XOR gate in the direction of the fourth side; and, wherein the outputs of the scan chains are inputs to a proximately located XOR gate in the first plurality of XOR gates and the second plurality of XOR gates.

In some embodiments, the CoDec further comprises a first encoder that encodes outputs of the XOR gates along the second side into a limited number of output bits. The CoDec may also comprise a second encoder that encodes outputs of the XOR gates along the fourth side into a limited number of output bits.

In some embodiments of the CoDec, the outputs of proximately located scan chains are XOR'd together and a result is used as the input to the proximately located XOR gate in the first plurality of XOR gates. In some of those embodiments, the result is used as the input to the proximately located XOR gate in the second plurality of XOR gates.

In addition to a distributed Compressor, some embodiments include a distributed Decompressor. In preferred embodiments, the Decompressor is constructed by dividing the input pins into a p by q 2-dimensional grid where p and q are both integers greater than zero. The inputs on a first side are formed by the odd combinations of the first p+1 input pins and the inputs on a second side are formed by all the combinations of q input pins and wherein the odd combinations on the second axis are XOR'd with the first input of the (p+1) inputs. However, in other embodiments, other decompression schemes may be used.

In another embodiment, a CoDec in a design for test integrated circuit is provided. In one embodiment, the CoDec comprises: a first plurality of outputs located along a first edge of the integrated circuit, each of the plurality of outputs being the XOR of a plurality of scan chain outputs located in a column in first direction across the integrated circuit away from the first edge; and a second plurality of outputs located along a second edge of the integrated circuit adjacent the first edge, the second plurality of outputs being the XOR of a plurality of scan chain outputs located in a row in a second direction across the integrated circuit away from the second edge, wherein the second direction is perpendicular to the first direction.

In some embodiments, the Codec further comprises a row encoder that encodes the first plurality of outputs into a limited number of output bits. In some embodiments, the CoDec further comprising a column encoder that encodes the second plurality of outputs into a limited number of output bits.

In another aspect of the present patent document, a design for test integrated circuit is provided. One embodiment of the design for test integrated circuit comprises: a CoDec with a plurality of regions wherein the regions form a 2-dimensional grid of rows and columns that covers a testable portion of the integrated circuit; a plurality of XOR gates located on the integrated circuit proximate to a first and second row that exclusive ORs the scan chains from the first row with scan chains from the second row; and a plurality of XOR gates located on the integrated circuit proximate to a first and second column that exclusive ORs the scan chains from the first column with scan chains from the second column, wherein the scan chains in each region in a column are XOR'd together to form a single output for that column and wherein the scan chains in each region in a row are XOR'd together to form a single output for that row; an encoder that encodes the outputs from each column into a limited number of bits; and, an encoder that encodes the outputs from each row into a limited number of bits.

In some embodiments, of the integrated circuit, the outputs from a plurality of scan chains in a single region are XOR'd together before being XOR'd with outputs from scan chains from another region.

In yet another aspect of the present patent document, a method of discovering a fault in a design for test integrated circuit is provided. In one embodiment of the method for discovering a fault in a design for test integrated circuit, the method comprises: decompressing a number of scan inputs into a larger number of scan chains; distributing the scan chains to shift registers on the integrated circuit; forming a 2-dimensional row and column grid of regions on the integrated circuit; exclusive ORing the outputs of the shift registers along a row to form a single output for each row; exclusive ORing the outputs of the shift registers along a column to form a single output for each column; compressing the outputs of the rows and the outputs of the columns into a number of scan outputs; and, comparing the scan outputs to expected outputs.

In some embodiments, the method further comprises determining from the scan outputs the row and columns where the fault was caused.

In yet another aspect of the present patent document, a design for test integrated circuit is provided. In one embodiment, the design for test integrated circuit comprises: a CoDec wherein the distributed decompressor is constructed by dividing the input pins into a p by q 2-dimensional grid wherein the inputs on a first axis are formed by the odd combinations of the first p+1 input pins and the inputs on a second axis are formed by all the combinations of q input pins and wherein the odd combinations on the second axis are XOR'd with the first input of the (p+1) inputs.

In some embodiments of the integrated circuit, the input to each region of the two dimensional grid is the XOR combination of the input to the first axis and the input to the second axis. Preferably, the inputs are XOR'd local to the region.

As described more fully below, the apparatus and methods of the embodiments for testing an integrated circuit are advantageous over existing methods and apparatus. Further aspects, objects, desirable features, and advantages of the apparatus and methods disclosed herein will be better understood from the detailed description and drawings that follow in which various embodiments are illustrated by way of example. It is to be expressly understood, however, that the drawings are for the purpose of illustration only and are not intended as a definition of the limits of the claimed invention.

DETAILED DESCRIPTION OF THE EMBODIMENTS

Figure 1:
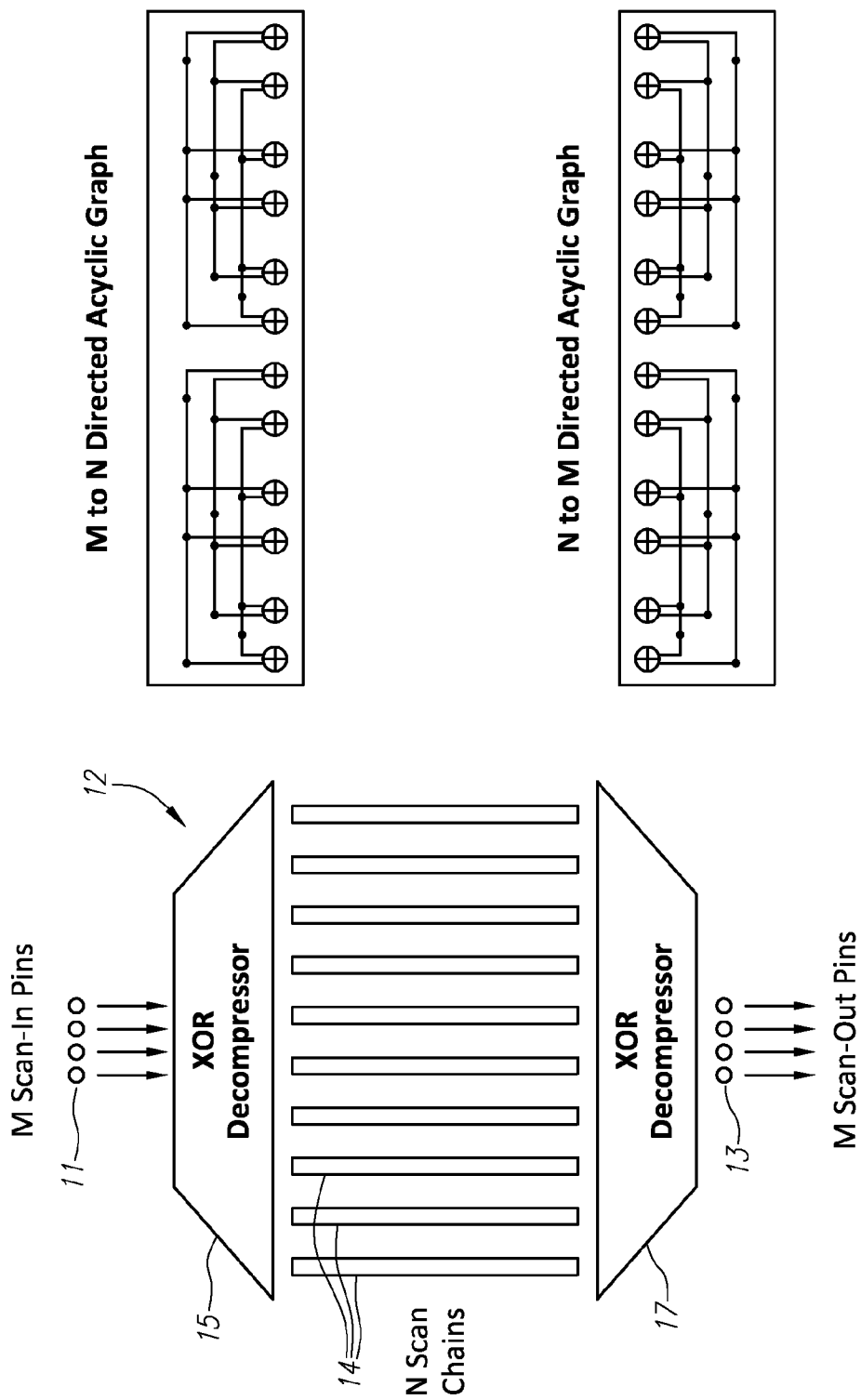
FIG. 1 illustrates an abstraction of the compression and decompression problem in converting M scan-in pins into N scan chains and N scan chains into M scan-out pins.

The following detailed description includes representative examples utilizing numerous features and teachings, both separately and in combination, and describes numerous embodiments in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

Some portions of the detailed descriptions that follow are presented in terms of algorithms and sequences of operations which are performed within a computer memory. These algorithmic descriptions and representations are the means used by those skilled in the data processing arts to most effectively convey the substance of their work to others skilled in the art. An algorithm or sequence of operations is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing," "computing," "calculating," "determining," "displaying" or the like, refer to the action and processes of a computer system, or similar electronic device, that manipulates and transforms data represented as physical (electronic) quantities within the computer system's registers and memories into other data similarly represented as physical quantities within the electronic device's memory or registers or other such information storage, transmission or display devices.

The embodiments disclosed also relate to an apparatus for performing the operations herein. This apparatus may be specially constructed for the required purposes, or it may comprise a general purpose processor selectively activated or reconfigured by a computer program stored in the electronic device. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, Flash memory, magnetic or optical cards, or any type of media suitable for storing electronic instructions, and each coupled to a computer system bus.

The algorithms presented herein are not inherently related to any particular electronic device or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the embodiments as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help understand how the present teachings are practiced, but not intended to limit the dimensions and the shapes shown in the examples.

The most common method for delivering test data from chip inputs to internal circuits under test ("CUT"), and observing their outputs, is called scan-design. Scan design is a form of structured DFT. Structured DFT involves adding extra logic and signals dedicated for test according to some procedure. The circuit has two modes, normal mode and test mode. In test mode, registers (flip-flops or latches) in the design are connected in one or more scan chains, which are used to gain access to internal nodes of the chip. Each scan chain is essentially a single shift register with the flip-flops or latches making up the individual registers. In traditional designs, each scan chain is connected to the chip input/output test pins via routed Scan-in Scan-out wires. In designs with compression logic, a compressor and decompressor may be located between the chip input/output test pins and the scan chain routes. Test patterns are shifted in via the scan chain(s), functional clock signals are pulsed to test the circuit during the "capture cycle(s)", and the results are then shifted out to chip output pins and compared against the expected "good machine" results. Each scan chain and/or its associated test pattern may be referred to as a channel.

One problem associated with DFT is that testing equipment and boards typically only have a few test input and test output pins. However, because it is advantageous to increase the number of scan chains to reduce their size, the DFT must figure out a way to turn a few scan input pins into a large number of scan chains and output a large number of outputs from all the scan chains on only a few scan output pins. The techniques to solve these problems are referred to as "decompression" and "compression" respectively. FIG. 1 illustrates an abstraction of the compression and decompression problem in converting M scan-in pins 11 into N scan chains 14 and N scan chains 14 into M scan-out pins 13. Given M Scan-In (SI) pins 11 and M Scan-Out (SO) pins 13, N compression mode scan channels 14 need to be built. The decompressor 15 connected between the SI pins 11 and the scan channels 14 is a M to N directed acyclic graph (DAG). The Compressor 17 located between the scan channels 14 and the SO pins 13 is a N to M DAG. The two components are collectively referred to as CoDecs 12.

Figure 2A:
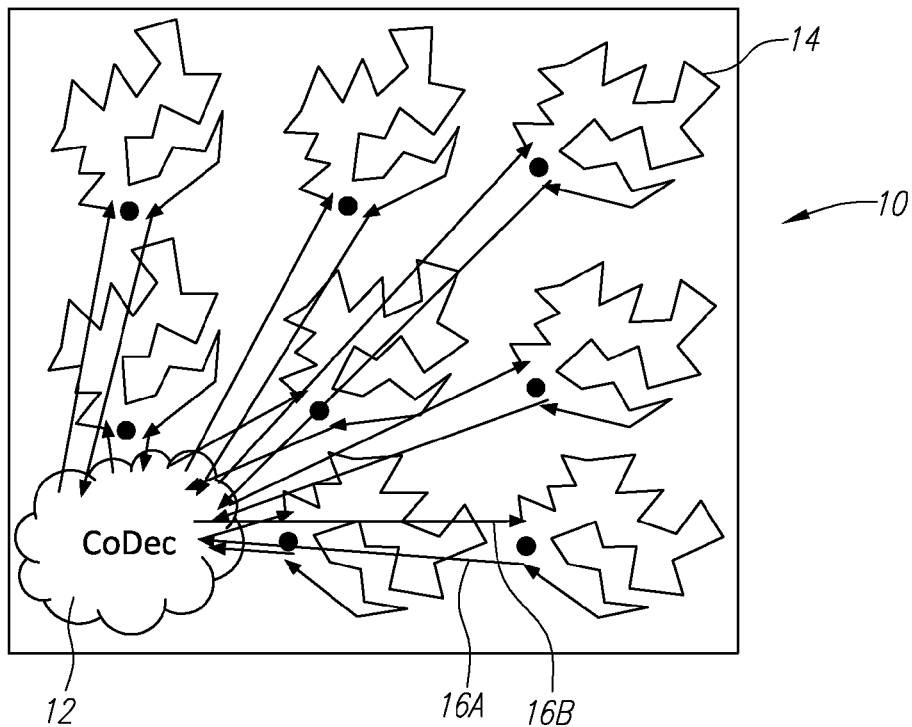
FIG. 2A illustrates a hypothetical integrated circuit (IC) with a design for test (DFT) that deconstructs the circuit into 8 scan chains in a point-to-point wiring scheme.

FIG. 2A illustrates a hypothetical IC with a DFT that deconstructs the circuit into 8 scan chains 14 in a point-to-point wiring scheme. As may be seen, CoDec 12 is located in the lower left corner of the chip. Each scan chain has a Scan-in line 16A and a Scan-out line 16B that routes the CoDec 12 to the input of the scan chain 14 and the output of the scan chain 14 respectively.

Figure 2B:
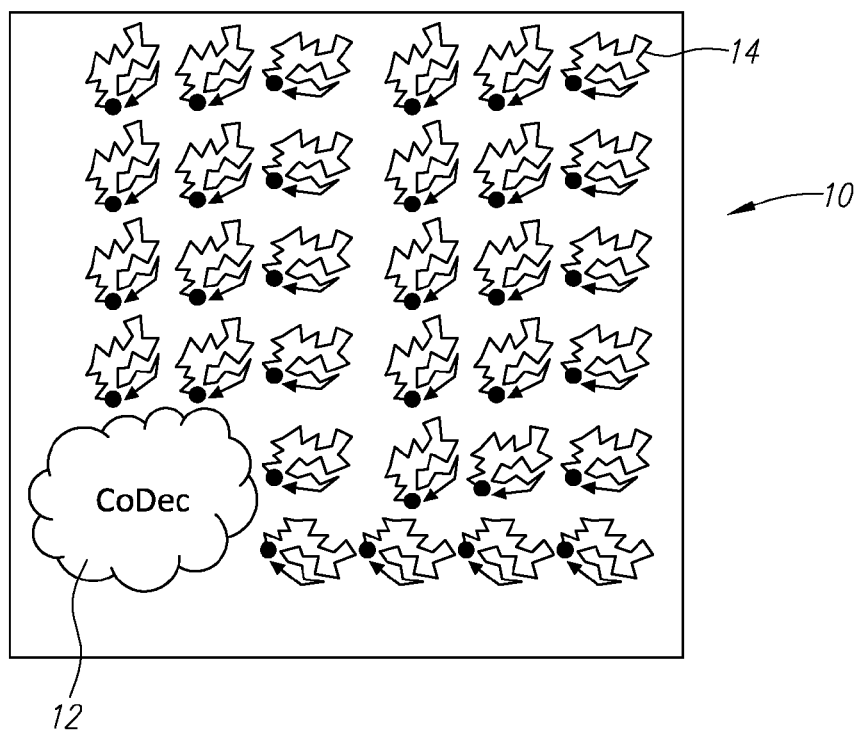
FIG. 2B illustrates the same hypothetical IC of FIG. 1A but with a DFT that deconstructs the circuit into 32 scan chains.

FIG. 2B illustrates the same hypothetical IC of FIG. 2A but with a DFT that deconstructs the circuit into 32 scan chains 14. In order to avoid totally cluttering FIG. 2B, the Scan-in 16A and Scan-out 16B lines are not shown between the CoDec 12 and each scan chain 14. However, one can easily visualize that the increase in scan chains 14 means an increase in Scan-in 16A and Scan-out 16B wires. The shorter the scan chains 14, the more total wire length needed to/from the CoDec 12. However, the total chain length is independent of the number of scan chains 14.

Comparing FIGS. 2A and 2B illustrates the wiring problems that occurs in a DFT integrated circuit ("IC") 10 as compression logic is scaled up to reduce the length of the scan chains 14. In current implementations, the CoDec 12 is connected from a single location on the chip via a point-to-point approach as shown in FIG. 2A. As the compression ratio is increased by increasing the number of shorter scan chains 14, the wire length to/from the CoDec 12 increases. Reducing the length of the scan chains 14 increases the number of scan chains 14 and the related Scan-in 16B and Scan-out 16A wiring to each scan chain 14.

Figure 3:
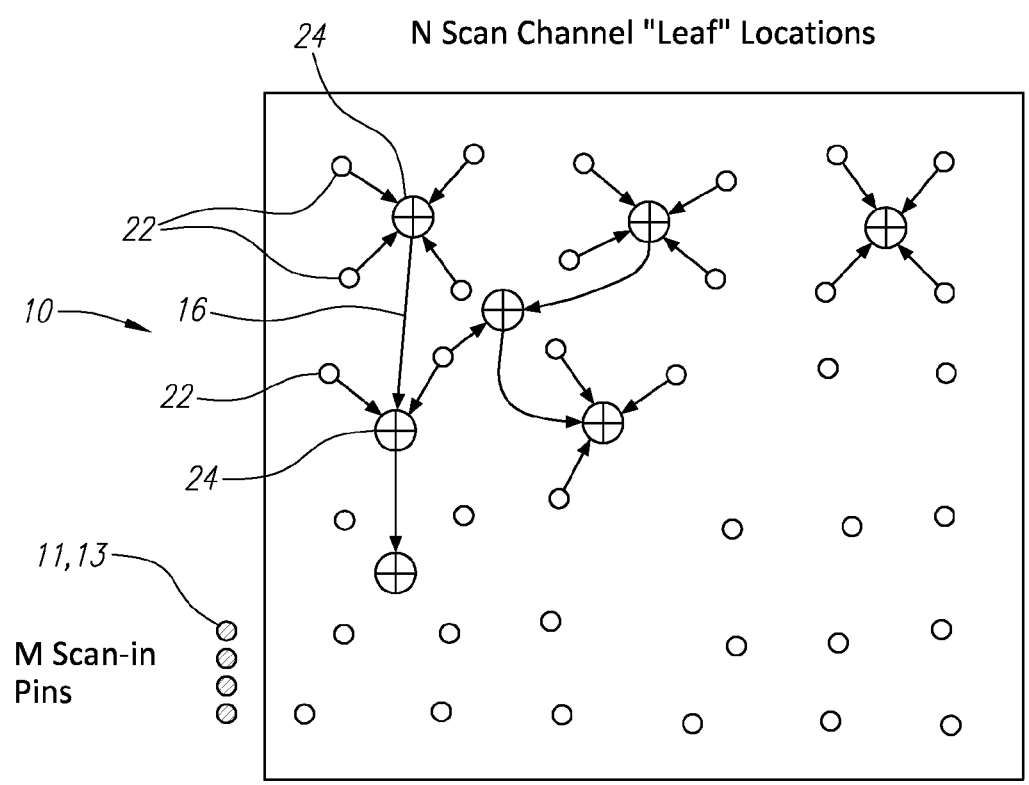
FIG. 3 illustrates an abstraction of the embodiments described herein, which take advantage of the 2-dimensionality of the layout and distribute the discrete XOR gates of the CoDec over the area of the chip.

One goal of the present embodiments is to allow an increase in the number of scan chains 14 while minimizing the total wire length of the scan-in 16A and scan-out 16B connections wires. Embodiments disclosed herein seek to achieve this goal by inserting a physically distributed CoDec that will reduce wire length and minimize congestion. FIG. 3 illustrates an abstraction of the embodiments described herein, which take advantage of the 2-dimensionality of the layout and distribute the discrete XOR gates of the CoDec over the area of the chip. FIG. 3 illustrates N scan channel nodes 22 and a plurality of XOR gate locations 24. Note that for clarity, only portion of the N scan nodes 22 and XOR gate locations 24 are labeled. As may be seen, a plurality of scan channel nodes 22 may be XOR'd together locally on the chip and then a single Scan-wire 16 may be used to transfer the information of a plurality of scan channel nodes 22 across the IC 10 to the M scan In/Out pins 11, 13.

In different embodiments, different schemes may be used to combine the different scan channel nodes 22. Generally, scan channels nodes located in the same physical regions may be combined by a local XOR gate. However, in some embodiments, more sophisticated schemes may be employed. For example, the IC 10 may be partitioned into rows and all the scan channel nodes 22 in a particular row maybe XOR'd together from one side of the chip to the other. To this end, if row information is maintained within the scan-out data, an error would allow the tester to resolve the particular row the error occurred in. In yet other embodiments, the IC 10 may be partitioned into columns and all the scan channels nodes 22 in a particular column may be XOR'd together from one side of the chip to the other. If column information is maintained within the scan-out data, an error would allow the tester to resolve the particular column the error occurred in. In some embodiments, a chip is partitioned into both rows and columns and the scan channels nodes 22 are XOR'd across the IC 10 in two different directions, one for the columns and one for the rows, and both column and row information is maintained in the scan-out data. In such an embodiment, a tester is able to resolve both the row and column the error occurred in. Accordingly, the tester can resolve the error to a specific two dimensional region of the chip.

Figure 4A:
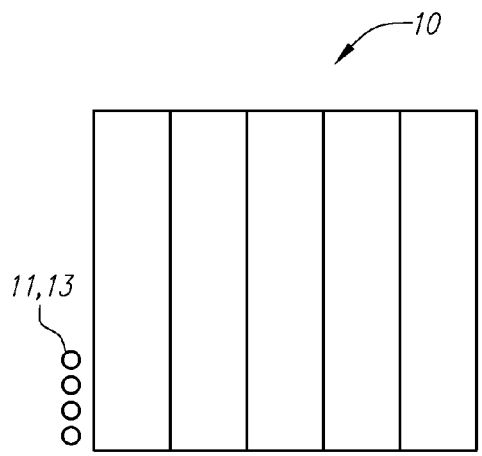
FIG. 4A illustrates a 1-dimensional column scheme for a CoDec.
Figure 4B:
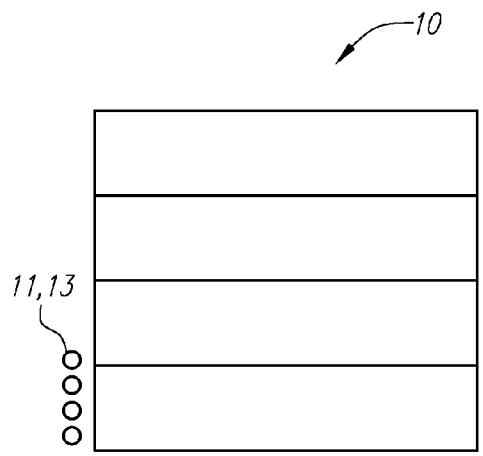
FIG. 4B illustrates a 1-dimensional row scheme for a CoDec.
Figure 4C:
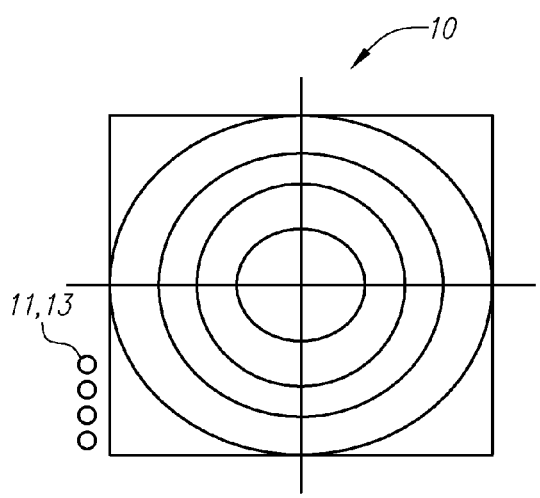
FIG. 4C illustrates a 2-dimensional polar scheme for a CoDec.
Figure 4D:
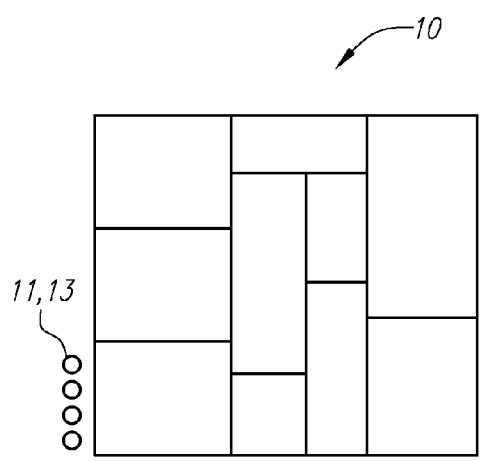
FIG. 4D illustrates a 2-dimensional block (tetris) scheme for a CoDec.

Schemes for partitioning the IC 10 and XORing various different scan channel nodes 22 together may be accomplished in numerous different ways. As discussed above, the schemes may be 1-dimensional or 2-dimensional. FIGS. 4A-4B provide some examples of different schemes for partitioning and IC 10. FIGS. 4A-4B are just illustrative of some examples and in other embodiments, other schemes may be used. As may be seen in FIGS. 4A and 4B, the partitioning scheme may be 1-dimensional. FIG. 4A illustrates a 1-dimensional column scheme. FIG. 4B illustrates a 1-dimensional row scheme. The schemes may be Cartesian, Polar, or even just region based such that regions of different sizes are created. FIG. 4C illustrates a polar scheme in which scan channel nodes between various radii in different quadrants are XOR'd together. FIG. 4D illustrates a scheme of different shape blocks. FIG. 4D may be referred to as a Tetris scheme. In each of the embodiments in FIGS. 4A-4D, the region information is associated and tracked with the output data through the output pins such that when an error occurs, the tester can resolve which particular region the error occurred in. In each of the embodiments shown, either the compression or the decompression or both parts of the CoDec are distributed across the defined regions. The regions being the areas that define which groups of scan chains are XOR'd together and also how the errors are associated with geographic regions of the IC.

Based on the particular topology of the chip design, one scheme may be more advantageous to another. Many factors play into this including the locations of the scan chains, the density of the scan chains, the distribution of the scan chains and the routing availability between locations.

Figure 5:
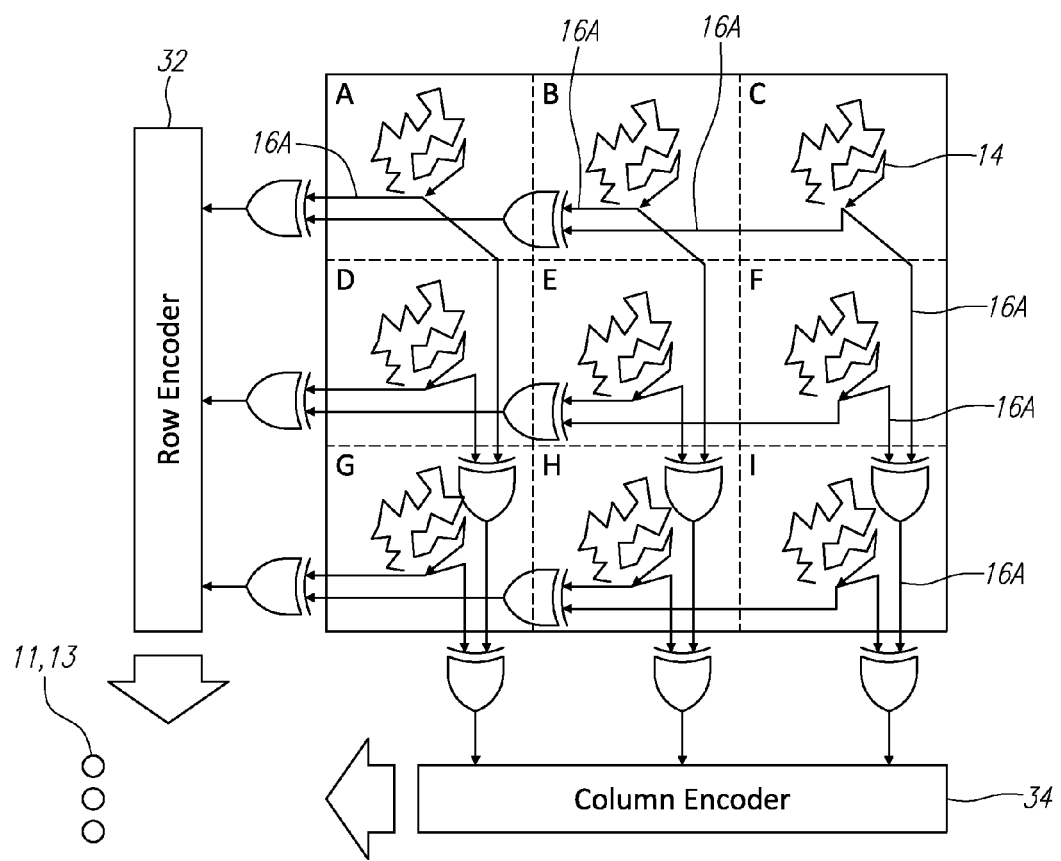
FIG. 5 illustrates one embodiment of an IC with a distributed compressor as part of its CoDec.

FIG. 5 illustrates one embodiment of an IC with a distributed compressor as part of its CoDec. As may seen in FIG. 5, the IC was partitioned into 9 regions labelled A-I. Partitioning a chip involves the association of a scan chain or group of scan chains 14 with an area of the chip. In the output data, information about particular scan chains 14 may be lost while information about the partitioned regions is maintained. Accordingly, when an error is discovered, the tester may resolve in what area of the IC the error occurred. Based on the area the error occurred in, the tester may resolve the error down to one of a group of scan chains 14 associated with that particular region.

As may be seen in FIG. 5, the compressor is distributed out onto the chip in a row and column configuration. Note that the distribution need not cover the entire chip area, but usually will do so. As may be seen in FIG. 5, each scan chain 14 is XOR'd with the other scan chains in its row starting from one side of the chip and progressing to the other side. The XOR gates are physically located on the chip in their respective rows either in between scan chains 14 or proximately located to its associated scan chain 14. The same scan chains 14 are also XOR'd with the other scan chains in their columns starting from the top of the chip and progressing to the bottom. The XOR gates are physically located on the chip in their respective rows in between scan chains 14 or proximately located to its associated scan chain 14.

In preferred embodiments, two XOR gates are associated with each region, one for XORing in the row direction and one for XORing in the column direction. There is an exception for the first row and first column. This is shown in FIG. 5. Regions C, F and I do not include an XOR gate in the row direction and thus regions F and I only include a single XOR gate that XORs the column containing C, F and I. Similarly, regions A, B and C do not include an XOR gate in the column direction and regions A and B only include a single XOR gate that XORs the row A, B, and C. Note region C does not contain any XOR gates as it is the start of both the rows and columns and thus falls under the exception in both directions.

In a preferred embodiment, each XOR gate is located proximate to the region it is associated with. The placement location of each XOR gate can vary depending on other layout constraints of a circuit design. However, each XOR gate is placed conveniently close to the output of associated scan chain(s) that will be subject to the XOR operation, leading to distribution of the XOR gates over at least a significant portion of chip area. In preferred embodiment, the XOR gate is located at least between regions such that it may XOR in the output of the scan chain prior to passing the scan chain of the next downstream region. For example, the XOR gate for region B is not located entirely in region B, however, it is proximately close to B such that the output of the scan chain in region B is XOR'd before the scan chain of region A is passed. To this end, only the single wire of the output of the XOR gate in region B needs to be propagated into region A. In some embodiments, each XOR gate may be entirely located within the region it is associated with.

To this end, all the scan chains in any single row are represented by a single value on the far left of the IC 10. This value is the exclusive OR of the output of each of the scan chains. Exclusive OR is used because it allows any single fault to be detected. When exclusive OR-ing a plurality of bits together, any single bit that is different will cause the opposite result. In addition, all the scan chains in any single column are represented by a single value on the bottom of the IC 10.

In preferred embodiments, the outputs of the various different regions are encoded into the output bits. This may be done in many different ways. In the embodiment shown in FIG. 5, the outputs of each column are encoded by a column encoder 34. In the embodiment shown in FIG. 5, the output of each row may be encoded in one of the output bits. To this end, if the output does not match the expected output, then the column where the fault occurred can be determined by figuring out which bit was different. The same process may be used for the rows and the output of each row may be encoded by a row encoder.

Figure 6:
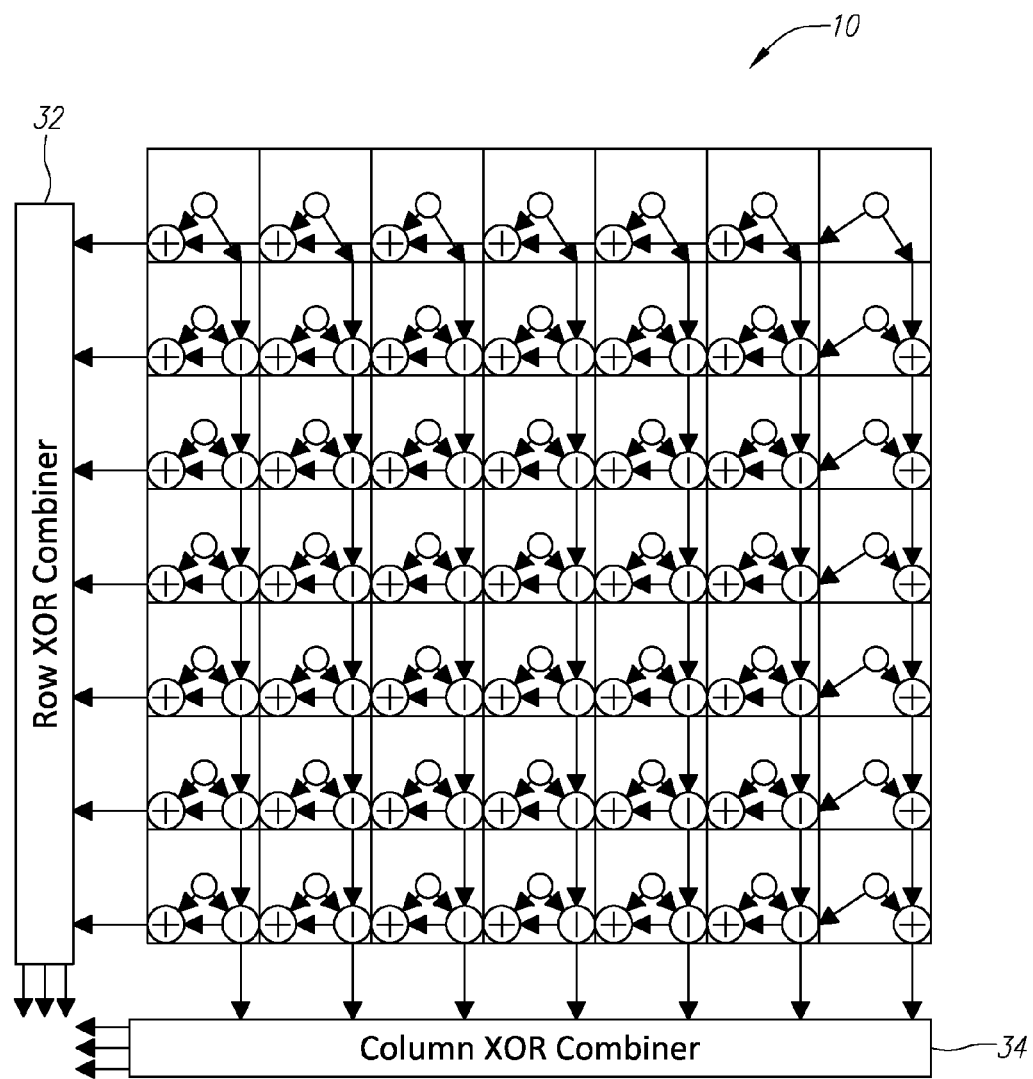
FIG. 6 illustrates an embodiment with a compression scheme similar to that shown in FIG. 5 only with more rows and columns.

FIG. 6 illustrates an embodiment with a compression scheme similar to that shown in FIG. 5 only with more rows and columns. The discrete XOR components of the CoDec are distributed closer to the grids where the scan channel heads and tails are physically located. Similar to the embodiment in FIG. 5, the embodiment in FIG. 6 partitions the compression mode scan channels into a 2-dimensional grid. The CoDec is distributed such that the XOR is done local to the grid close to the channel heads and tails. The Compressor is implemented such that the XOR tree is built in two directions—along the row and then along the columns, and there is a row/column encoder 32, 34 along two of the edges that can be efficiently implemented. An encoding scheme such as a Gray code can quickly lead to the detection of the failing row or column leading to a diagnosis of where the fault occurred.

In the embodiment shown in FIG. 6, the channels are partitioned into a 2-D grid with row and column XORs. All the channel tails along each row are XOR'd and fed to a row combiner. The same is true for each column, in that the channel tails along each column are XOR'd and fed to a row combiner.

As one skilled in the art will appreciate, M scan out ports can observe a maximum of $N=2^M$ chains uniquely. As just one example, Encounter Diagnostics has special diagnostic algorithms that can be used to isolate a specific failing chain by analyzing the cone of logic feeding the chains. Accordingly, the maximum grid spacing for M scan out pins that allows resolution to each grid square is a grid with $(M/2)^2$ rows by $(M/2)^2$ columns. Each row and column combiner takes $(M/2)^2$ inputs and produces M/2 row and column outputs respectively. These row and column outputs can be connected directly to the M scan out ports.

In some embodiments, the number of chains may be greater than $N=2^M$. Since M scan out ports can observe a maximum of $N=2^M$ chains uniquely, if $N>2^M$ chains, then additional chains may be XOR'd locally per grid with essentially zero wiring cost. If there is more than one chain in a grid (say a, b, c & d) that are locally XOR'd, a fault to the specific chain a vs b vs c vs d may not be able to be determined by just looking at the response data. However localizing the fault to a specific grid or small location is still a huge advantage, especially in view of the savings in wiring costs.

Figure 7:
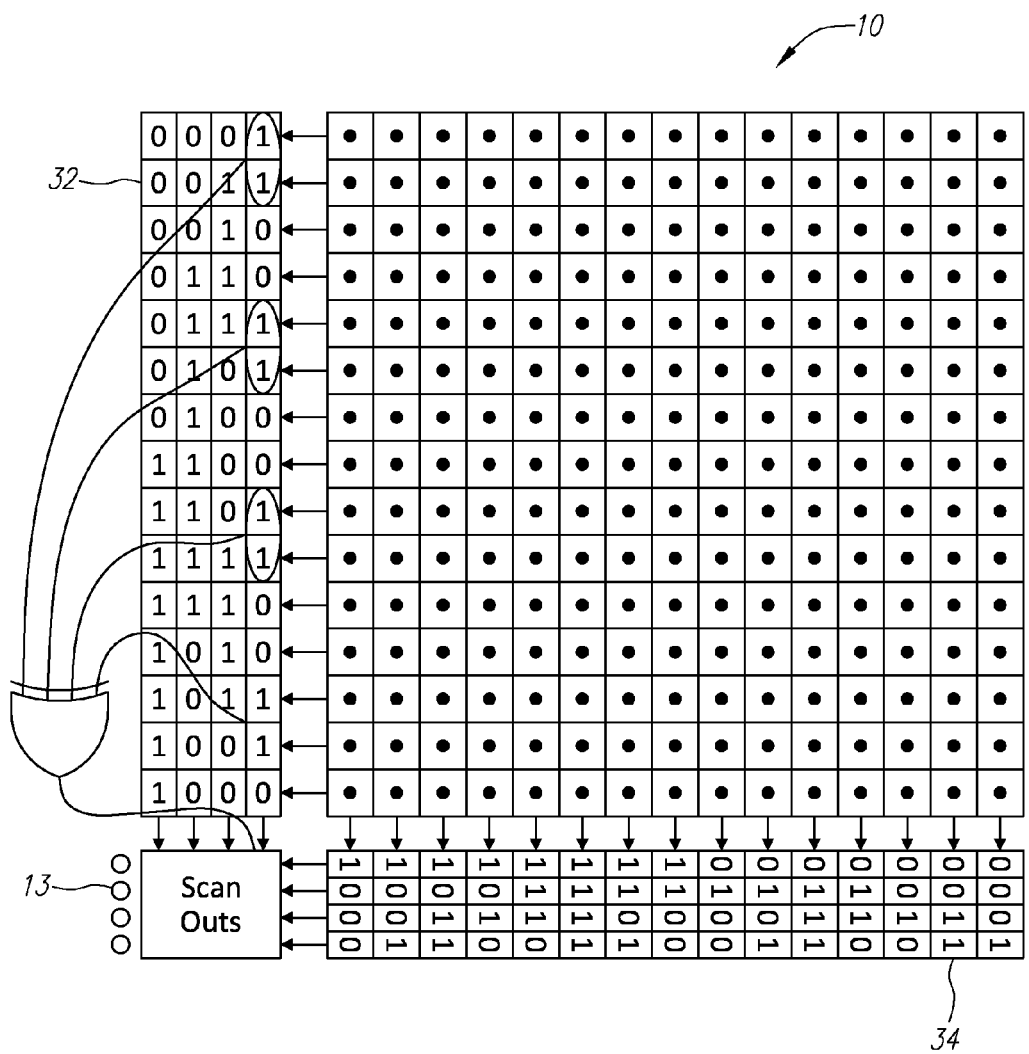
FIG. 7 illustrates one example of a row/column encoder for use with a DFT IC that has a row/column compressor.

FIG. 7 illustrates one example of a row/column encoder for use with a DFT IC that has a row/column compressor. The embodiment of the compressor in FIG. 7 assigns a unique binary "code" to each row and column such that #1's in each bit position across all the codes is about the same. As may be seen in the embodiment in FIG. 7, each row and column has been assigned a Gray Code. Using Gray Code is a systematic way of assigning a unique binary code to each row and column while distributing 1's evenly across each bit position. In other embodiments, other types of codes may be used.

In operation, the codes can be used to isolate the row or column the fault occurred in. If there is a fault in row (r), then the Gray code for that row will be activated, i.e. set for that row. All other rows will encode to all 0's. To this end, each row code may be summed together and the output code will result on the output pins. Assuming only a single row failed at a time, the exact row where the failure occurred may be resolved. The same is true for the columns.

As a working operational example, assume the expected output for a no-fault condition is all 0s for a given test pattern cycle. If a fault exists in any cell in a particular row then the faulty response will lead to a 1 value being transmitted across the row to the row compressor 32 by the XOR gates in that row. In this working example, assume a fault has occurred so the row compressor 32 receives a 1. The row compressor compares the 1 with the expected result of 0 and recognizes a fault has occurred. Accordingly, the row compressor 32 sets the code for that row. Similarly, the column associated with the fault will pass a 1 to the column encoder 34 activating the column code for that column. Assume the row code for the faulty row is 0001 and the column code for the faulty column is 0100, then the corresponding scan outputs, say the 4th and 6th scan outputs (assuming there are 8 scan outputs) will be set to 1s instead of to 0s. A diagnostics program can reverse map the pattern seen at the scan outputs to the corresponding faulty row and column and further isolate it to the corresponding grid location. Depending on the scan cycle on which this faulty pattern was detected, the corresponding scan bits in that position within the scan chains placed in the faulty grid location are identified as having captured the fault effect.

The row and column combiners combine all the row or column outputs down to a single output at the output pins. This may be accomplished in a number of different ways. For example, in the embodiment in FIG. 7, each bit of the four bit code may be XOR'd with the corresponding bit from all the other rows. However, because the rows have set codes, only the bits that potentially may result in a 1 need to be tracked. To this end, as may be seen in FIG. 7, only certain bits, the ones that may potentially be a 1, need to be XOR'd together with the other corresponding bits from the other rows that may potentially be a 1. This saves on additional wiring.

In a preferred embodiment, we are XORing all the bit positions that are potentially 1 in the Gray code. Accordingly, the Gray code for the faulty row will appear at the output of the row encoder. For example if row 2 is faulty then the code 0011 is activated by that row and will appear at the output of the row encoder.

It may be proven that if a row/column distributed compressor is used instead of a point to point compressor wiring, a significant reduction in total wire length is achieved. If the number of scan chains N<=2^M where M is the number of output pins, then the wire length may be expressed as O(N) while a point to point solution requires a wire length of O(N^(3/2)).

If the number of channels exceeds 2^M then wiring that is local to the grid that allows multiple channels to be controlled (observed)) from a smaller number of CoDec inputs (outputs) may be added. Since the local wire length within each grid is basically zero (all local short distances), the increase is wire length with higher compression ratios is bounded. The scheme permits very precise physical isolation of failing scan bits since there is a clean mapping between failing response and grid location. Last but not least the implementation can be done in in a physically-aware synthesis tool that can read in a floorplan of a chip prior to transforming the RTL description of the design into gates and no additional information is needed. Scan wiring congestion fixing in the backend place and route tools is also mitigated.

Although in some embodiments only a distributed compressor may be used, in other embodiments a CoDec may use a distributed decompressor as well. In yet other embodiments, a CoDec may only have a distributed decompressor and not a distributed compressor.

In a preferred embodiment, especially an embodiment that uses a row/column grid compressor, the decompressor may similarly supports a 2-D grid of local XORs for the channel heads and row and column decoders along the two edges. In the embodiment shown in FIG. 8, the decompression scheme allows any number of scan input pins to be partitioned so the XOR supports the linearly independent set of linear equations required by the ATPG tool to convert the care bits for each test pattern into the corresponding scan input bit values.

Figure 8:
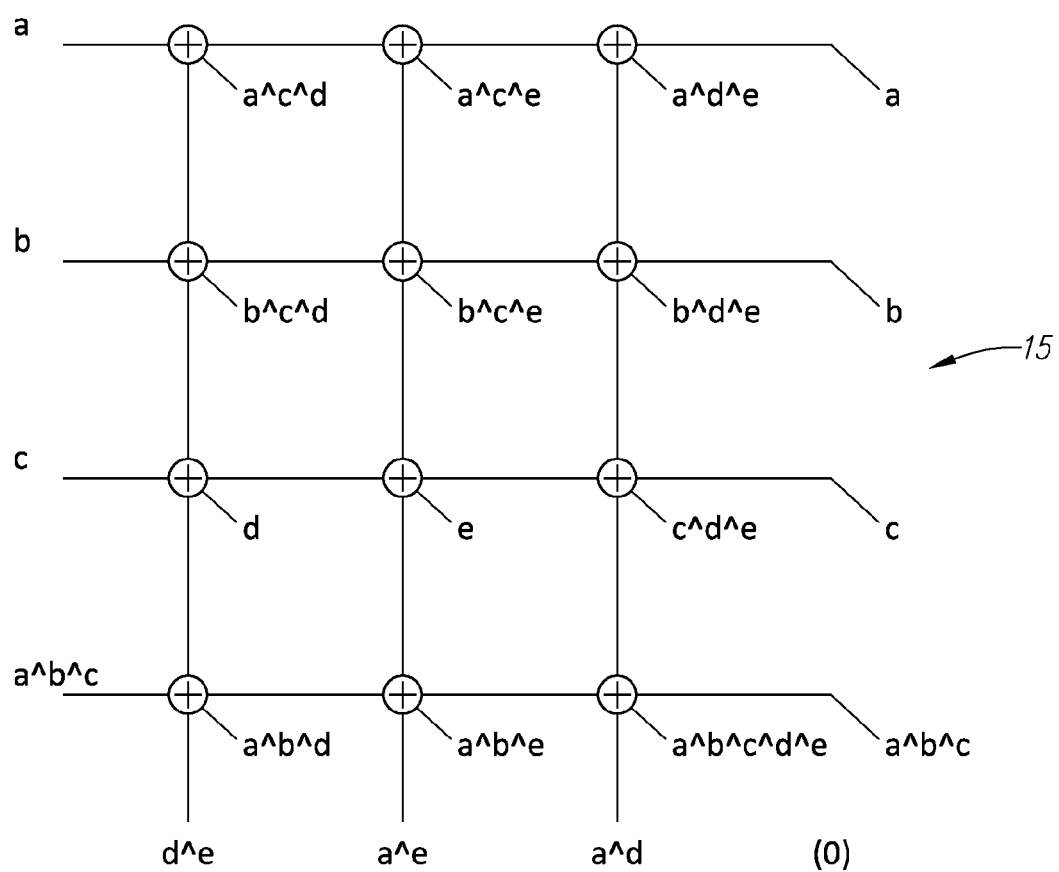
FIG. 8 illustrates one example of a decompression scheme for use with a DFT IC that includes a distributed CoDec.

FIG. 8 illustrates one embodiment to decompress the M scan inputs to obtain M=(p+q+1) scan inputs to create a $2^p \times 2^q$ grid. In FIG. 8, 5 scan input pins are decompressed to feed a 4×4 grid. In the embodiment of FIG. 8, p=2 and q=2 such that a 4×4 grid is created from 5 scan inputs labelled (a, b, c, d, e). However, the same process may be used for larger grids given a larger number of scan inputs. Moreover, the same process may be used to create non-symmetrical grids i.e., p≠q.

In the embodiment of FIG. 8, all the combinations of the first (p+1) inputs with an odd number of terms are placed on the first axis. Assuming the scan input pins are labelled a, b, c, d, and e, the (p+1) pins where p=2 are a, b, and c. The combinations of a, b and c that have an odd number of terms yields the set (a, b, c, a^b^c).

Next, all combinations of the last q inputs are placed on the second axis, with the one restriction that if there is a combination with an odd number of terms, then the combination is XOR'd with the first input (a in this case). Where q=2 in our example, the q pins are the set (d, e). Thus, all combinations of the set (d, e) yields the set (0, d, e, d^e). Note, that 0 is also added to the set. The rule technically accounts for this because if a column is 0 then there is no wire routed vertically up that column. Instead, at each grid the equation that is routed horizontally across that row is utilized. Because the d and e in the set are combinations with an odd number of terms, each must be XOR'd with "a" and thus, the y axis inputs are the set (0, a^d, a^e, d^e).

A decompressor comprised of the XOR of odd-numbered groupings of M scan in pins can support up to $2^{(M-1)}$ scan channels. The embodiment discussed above leads to a linearly independent equation of XORs for each channel head and the solution can support up to 3 care bits in a scan slice (shift cycle). Our solution allows the M scan-in pins to be decomposed into a partition of M=p+q+1. If the number of scan chains N is greater than $2^M$, then some embodiments may feed the same value to other channel heads in the same grid. For example, if there are multiple channels in the same grid square due to the fact that N is greater than $2^M$, then all the channel heads in the same grid square may be fed the same XOR equation value.

Similar to the way the compressor is distributed across the IC, in preferred embodiments, the decompressor is also distributed across the IC. To this end, the required XOR gates may be spread over the surface of the chip. Also similar to the compressor, the distributed decompressor reduces wire length. If number of scan channels $N<=2^M$ then the wire length for the decompressor with the embodiment above is O(N). The conventional point-to-point wire length for a decompressor is $O(N^{3/2})$.

As another example, the same decompressor rules may be used to construct a decompressor for more scan in pins 11. In addition, the decompressor may set up a non-symmetric grid p≠q. For example, 8 scan in channels may be used to set up a 16×8 grid. Assuming the scan in channels are labelled a, b, c, d, e, f, g and h a 16×8 grid can be set up (p=4, q=3). The resulting channels for the rows would be the set (a, b, c, d, e, a a^b^c, a^b^d, a^b^e, a^c^d, a^c^e, a^d^e, b^c^d, b^c^e, b^d^e, c^d^e, a^b^c^d^e) The resulting channels for the columns would be the set (0, a^f, a^g, f^g, a^h, f^h, g^h, a^f^g^h). In other embodiments, different numbers of scan-in pins 11 may be supported. In addition, different sizes of symmetric or unsymmetrical grids may be constructed.

Figure 9:
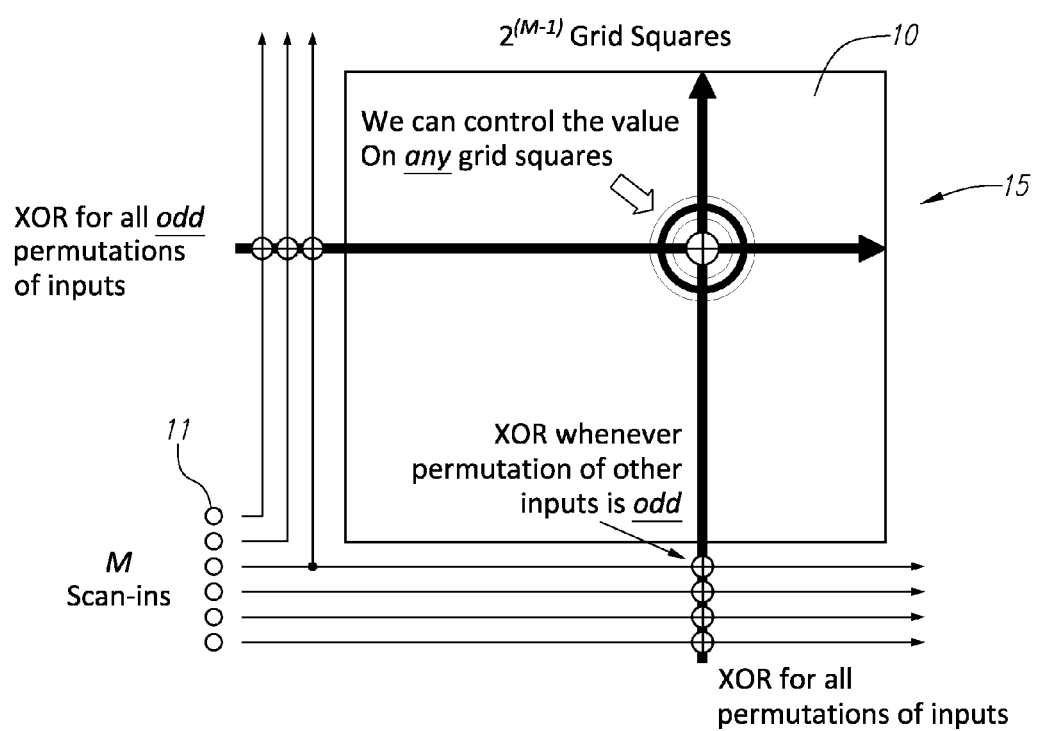
FIG. 9 illustrates a graphical example of the decompressor of FIG. 8.

FIG. 9 illustrates a graphical example of the decompressor of FIG. 8. As may be seen in FIG. 9, all permutations of the first (p+1) inputs with an odd number of terms are XOR'd along the Y axis. Along the X axis, the q inputs are XOR for all permutations and whenever the result is an odd number of inputs, the result is XOR'd with the first input from the Y axis. With this decompression scheme, $2^{(M-1)}$ gird squares may be supported and the value of any 3 grid squares may be controlled.

The embodiments described herein take a structured approach to scan chain partitioning. In preferred embodiments, a 2D grid with local XORs and row (column) Encoders (Distributors) along two edges are used. The physical impact may be predictable and allows for joint Design-for-Test and Design Planning within the physical synthesis environment cockpit. The development is all contained within the physical synthesis software and no back-end tool place and route tool enhancements are needed.

Figure 10:
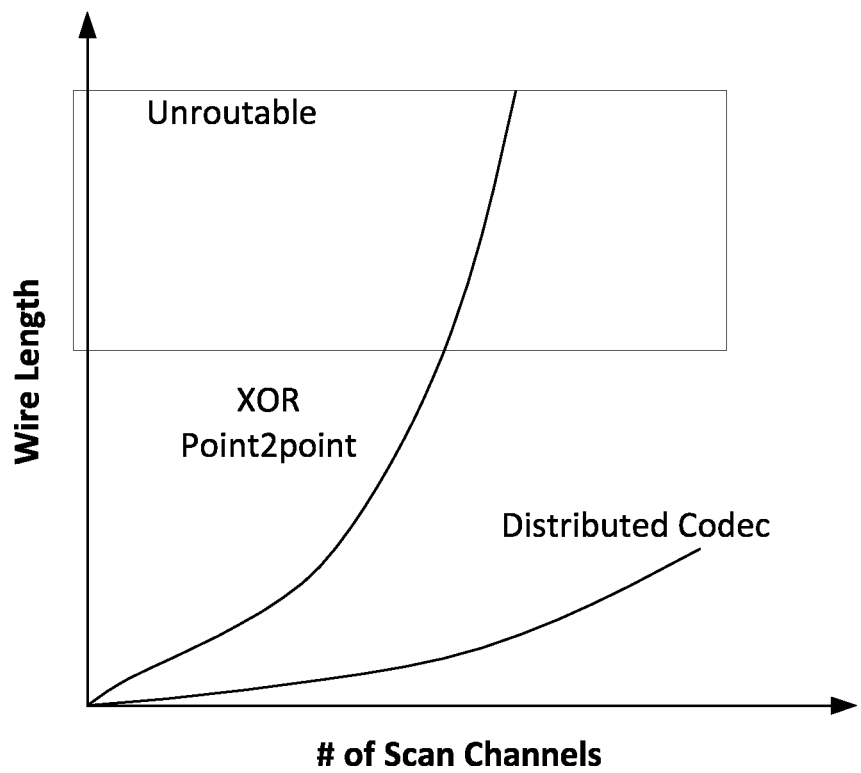
FIG. 10 illustrates the difference in wire length (on the Y axis) to the number of scan channels (on the X axis) when a CoDec is wired using point-to-point versus a distributed CoDec as described herein.

FIG. 10 illustrates the difference in wire length on the Y axis to the number of scan channels on the X axis when a CoDec is wired using point-to-point versus a distributed CoDec. As may be seen, as the number of scan channels increases, point-to-point wiring increases asymptotically into the unroutable area while with the distributed CoDec the wire length only slowly increases.

Although the embodiments have been described with reference to preferred configurations and specific examples, it will readily be appreciated by those skilled in the art that many modifications and adaptations of the apparatus and methods described herein are possible without departure from the spirit and scope of the embodiments as claimed hereinafter. Thus, it is to be clearly understood that this description is made only by way of example and not as a limitation on the scope of the embodiments as claimed below.

What is claimed is:

1. A CoDec in a design for test integrated circuit, the design for test integrated circuit divided into a plurality of regions, the plurality of regions arranged to form a plurality of rows of regions and columns of regions, comprising:
a plurality of scan chains, each of the plurality of scan chains fabricated within one of the plurality of regions;
a first plurality of XOR gates fabricated on the design for test integrated circuit, each of the first plurality of XOR gates connecting to an output of at least one of the plurality of scan chains, the first plurality of XOR gates physically located starting on a first side of each of the plurality of rows of regions of the integrated circuit and progressing across each of the plurality of rows of regions to a second side of each of the plurality of rows of regions on the opposite side from the first side, wherein the output of each of the first plurality of XOR gates, starting on the first side, are connected to an input of a successive one of the first plurality of XOR gates in the direction of the second side;
a second plurality of XOR gates fabricated on the design for test integrated circuit, each of the second plurality of XOR gates connecting to an output of at least one of the plurality of scan chains, the second plurality of XOR gates physically located starting on a third side of each of the plurality of columns of regions of the integrated circuit, the third side being adjacent to the first side, and progressing across each of the plurality of columns of regions to a fourth side of each of the plurality of columns of regions on the opposite side from the third side, wherein the output of each of the second plurality of XOR gates, starting on the third side, are connected to an input of a successive one of the second plurality of XOR gates in the direction of the fourth side.

2. The CoDec of claim 1, further comprising a first encoder that encodes outputs of the first plurality of XOR gates along the second side into a limited number of output bits.

3. The CoDec of claim 2, further comprising a second encoder that encodes outputs of the second plurality of XOR gates along the fourth side into a limited number of output bits.

4. The CoDec of claim 1, wherein the outputs of the plurality of scan chains in adjacent ones of the plurality of regions are exclusive OR'd together and a result is used as the input to an adjacent one of the first plurality of XOR gates.

5. The CoDec of claim 1 further including a distributed decompressor, wherein the distributed decompressor is constructed by dividing the input pins into a p by q 2-dimensional grid where the inputs on a first side are formed by the odd combinations of the first p+1 input pins and the inputs on a second side are formed by all the combinations of q input pins and wherein the odd combinations on the second axis are XOR'd with the first input of the (p+1) inputs.

6. A CoDec in a design for test integrated circuit, the design for test integrated circuit divided into a plurality of regions, the plurality of regions arranged to form a plurality of rows of regions and columns of regions, comprising:
a plurality of scan chains, each of the plurality of scan chains fabricated within one of the plurality of regions;
a first plurality of outputs located along a first edge of the integrated circuit, each of the first plurality of outputs corresponding to one of the plurality of columns of regions, each of the first plurality of outputs being the XOR of outputs of the plurality of scan chains fabricated within each region of one of the plurality of column of regions in a first direction across the integrated circuit away from the first edge;
a second plurality of outputs located along a second edge of the integrated circuit adjacent the first edge, each of the second plurality of outputs corresponding to one of the plurality of rows of regions, each of the second plurality of outputs being the XOR of outputs of the plurality of scan chains fabricated within each region of one of the plurality of row of regions in a second direction across the integrated circuit away from the second edge, wherein the second direction is perpendicular to the first direction.

7. The CoDec of claim 6, further comprising a first encoder that encodes the first plurality of outputs into a limited number of output bits.

8. The CoDec of claim 7, further comprising a second encoder that encodes the second plurality of outputs into a limited number of output bits.

9. The integrated circuit of claim 7, wherein outputs from a plurality of scan chains in a single region are XOR'd together before being XOR'd with outputs from scan chains from another region.

10. The CoDec of claim 6 further including a distributed decompressor, wherein the distributed decompressor is constructed by dividing the input pins into a p by q 2-dimensional grid where the inputs on a first side are formed by the odd combinations of the first p+1 input pins and the inputs on a second side are formed by all the combinations of q input pins and wherein the odd combinations on the second axis are XOR'd with the first input of the (p+1) inputs.

11. A design for test integrated circuit comprising:
a CoDec with a plurality of regions wherein the regions form a 2-dimensional grid of rows and columns that covers a testable portion of the integrated circuit, each of the plurality of regions having a scan chain fabricated therein;
a plurality of XOR gates fabricated on the integrated circuit proximate to a first and second row that exclusive ORs outputs of the scan chain from one of the regions of the first row with outputs of the scan chain from an adjacent region of the second row; and
a plurality of XOR gates fabricated on the integrated circuit proximate to a first and second column that exclusive ORs outputs of the scan chain from one of the regions of the first column with outputs of the scan chain from an adjacent region of the second column;
wherein the scan chains in each region in a column are XOR'd together to form a single output for that column;
wherein the scan chains in each region in a row are XOR'd together to form a single output for that row;
an encoder that encodes the outputs from each column into a limited number of bits; and
an encoder that encodes the outputs from each row into a limited number of bits.

* * * * *